(12) United States Patent
Cho et al.

(10) Patent No.: US 7,799,512 B2
(45) Date of Patent: Sep. 21, 2010

(54) METHOD FOR FORMING RING PATTERN

(75) Inventors: Kuo-Yao Cho, Taipei (TW); Jen-Jui Huang, Taipei (TW)

(73) Assignee: Nanya Technology Corp., Taiwan (CN)

( * ) Notice: Subject to any disclaimer, the term of this patent is extended or adjusted under 35 U.S.C. 154(b) by 483 days.

(21) Appl. No.: 11/742,272

(22) Filed: Apr. 30, 2007

(65) Prior Publication Data
US 2008/0206684 A1    Aug. 28, 2008

(30) Foreign Application Priority Data
Feb. 26, 2007    (TW) .............................. 96106380 A

(51) Int. Cl.
*G03F 7/26* (2006.01)

(52) U.S. Cl. ...................... 430/316; 430/313; 430/394; 430/323

(58) Field of Classification Search ................. 430/322, 430/316, 394, 323, 312, 313, 30, 22
See application file for complete search history.

(56) References Cited

U.S. PATENT DOCUMENTS 6,093,640 A * 7/2000 Hsu et al. .................... 438/631
6,573,030 B1 * 6/2003 Fairbairn et al. ............. 430/323
2002/0106587 A1 * 8/2002 Lukanc et al. ............... 430/312

* cited by examiner

*Primary Examiner*—Kathleen Duda
*Assistant Examiner*—Caleen O Sullivan
(74) *Attorney, Agent, or Firm*—Ingrassia Fisher & Lorenz, P.C.

(57) ABSTRACT

A method for forming a ring pattern is disclosed. The ring pattern has a first wall and a second wall. The method includes the following steps: (a) providing a substrate; (b) forming a dielectric layer on the substrate; (c) forming a first patterned photoresist layer on the dielectric layer, the first patterned photoresist layer defining the first wall; (d) etching the dielectric layer to a predetermined depth by using the first patterned photoresist as a mask, and then removing the first patterned photoresist layer; (e) forming a second patterned photoresist layer on the dielectric layer, the second patterned photoresist layer defining the second wall; (f) etching the dielectric layer by using the second patterned photoresist layer as a mask so as to form the ring pattern having the first wall and the second wall.

7 Claims, 8 Drawing Sheets

METHOD FOR FORMING RING PATTERN

CROSS REFERENCE TO RELATED APPLICATIONS

This application claims the right of priority based on Taiwan Patent Application No. 96106380 entitled "Method For Forming Ring Pattern," filed on Feb. 26, 2007, which is incorporated herein by reference and assigned to the assignee herein.

FIELD OF THE INVENTION

This invention relates to a semiconductor structure, and more particularly, relates to a method of forming a ring type semiconductor structure.

BACKGROUND OF THE INVENTION

In general, for forming a ring pattern on a semiconductor substrate, a dielectric layer, such as boron phosphate silicate glass (BPSG), may be formed on the semiconductor substrate, and then a positive photoresist is formed on the dielectric layer. Next, a photomask shown in FIG. 1 is employed as a mask and then the positive photoresist is exposed and developed to form a patterned photoresist. When the positive photoresist is irradiated by light, the polymer bonding within the positive photoresist will be cut off so that the exposed portion of the photoresist can be removed in a subsequent development step. That is, after the development step, the desired ring pattern 101 is transferred to the positive photoresist. Subsequently, an unprotected portion of the substrate can be etched to a depth during an etching step by using the patterned photoresist as a mask. Finally, the positive photoresist is removed and the desired ring structure is formed.

However, the ring pattern 101 shown in FIG. 1 of the photomask is impacted by the exposure process which causes the inner wall and outer wall of the ring shown in FIG. 1 not to keep a constant distance d. Moreover, in the conventional etching process not only the dielectric layer is etched, but also a portion of the photoresist is etched. Therefore, a thicker photoresist layer is generally required to make sure that an unexpected structure will not result from the etching step due to the completely consumption of the photoresist.

Accordingly, it is desired to provide a method of forming a ring pattern, which overcomes the limitation of the patterning processes and reduces the cost by reducing the thickness of the photoresist.

SUMMARY OF THE INVENTION

One aspect of the present invention is to provide a method of forming a ring pattern, which includes a first wall and a second wall. The method includes the following steps: (a) providing a substrate; (b) forming a dielectric layer on the substrate, the dielectric layer having a thickness T; (c) forming a first patterned photoresist layer on the dielectric layer, the first patterned photoresist layer defining the first wall; (d) etching the dielectric layer to a predetermined depth by using the first patterned photoresist layer as a mask, and then removing the first patterned photoresist layer; (e) forming a second patterned photoresist layer on the dielectric layer, the second patterned photoresist layer defining the second wall; and (f) etching the dielectric layer by using the second patterned photoresist layer as a mask so as to form the ring pattern having the first wall and the second wall.

In one embodiment, the dielectric layer implemented in the present invention is a carbon layer. In another embodiment, the dielectric layer is etched to a depth about ½T by using the first patterned photoresist layer as a layer.

DETAILED DESCRIPTION OF THE INVENTION

The present invention provides a method of forming a ring pattern. The description of the present invention may be more detail and complete by reference to the following description in conjunction with the accompanying drawings from FIG. 2 to FIG. 16.

Figure 1:
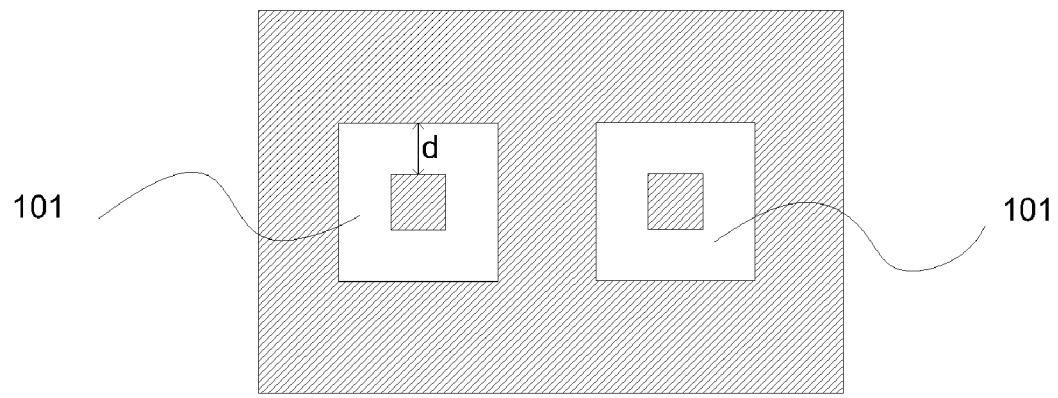
FIG. 1 showing a mask pattern for use in forming a ring pattern on a semiconductor substrate in accordance with the prior art.
Figure 2:
FIG. 2 showing a cross-sectional view in the process of forming a ring pattern in accordance with an embodiment of the present invention.
Figure 3:
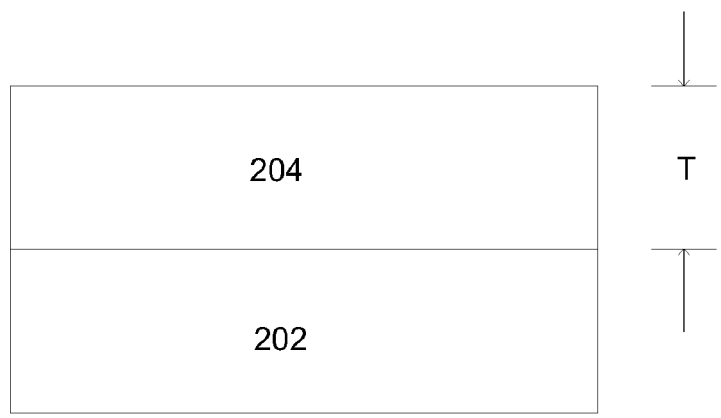
FIG. 3 showing a cross-sectional view in the process for forming a ring pattern in accordance with an embodiment of the present invention.
Figure 4:
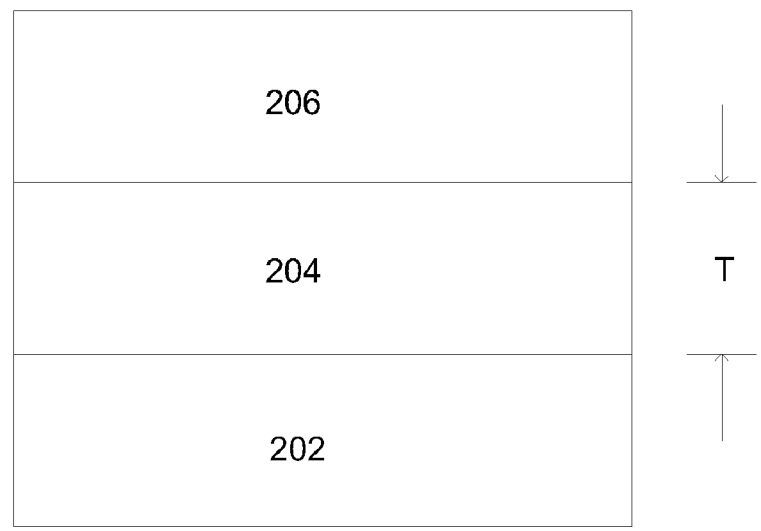
FIG. 4 showing a cross-sectional view in the process of forming a ring pattern in accordance with an embodiment of the present invention.
Figure 5:
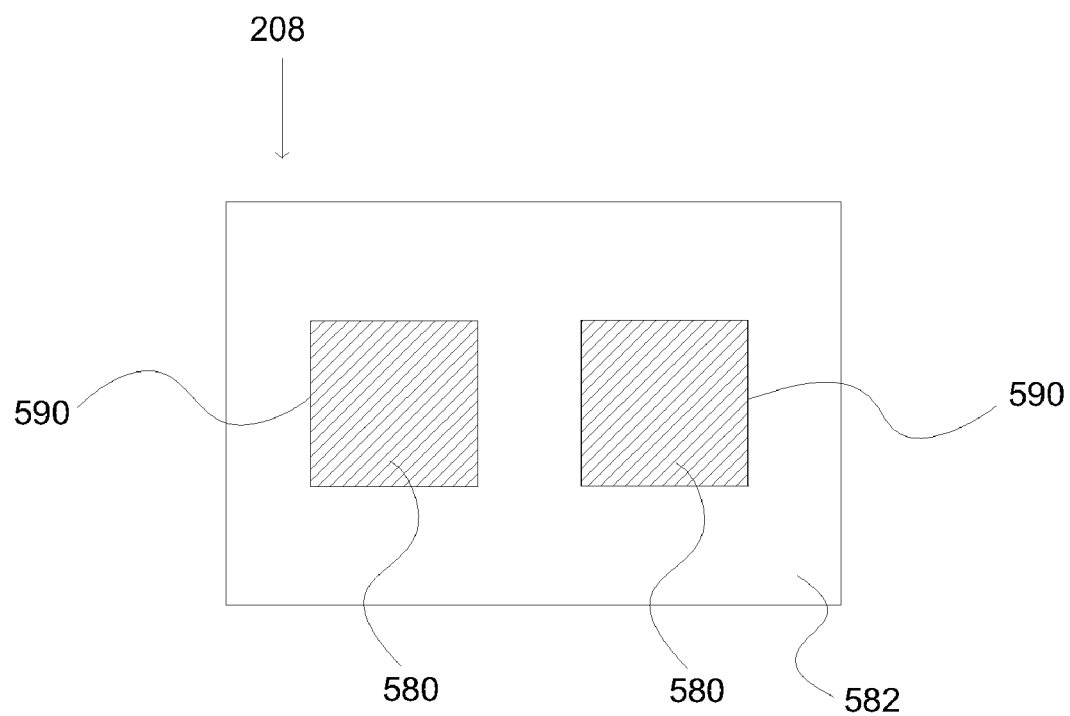
FIG. 5 showing a top view of a photomask pattern for use in the process of forming a ring pattern in accordance with an embodiment of the present invention.
Figure 6:
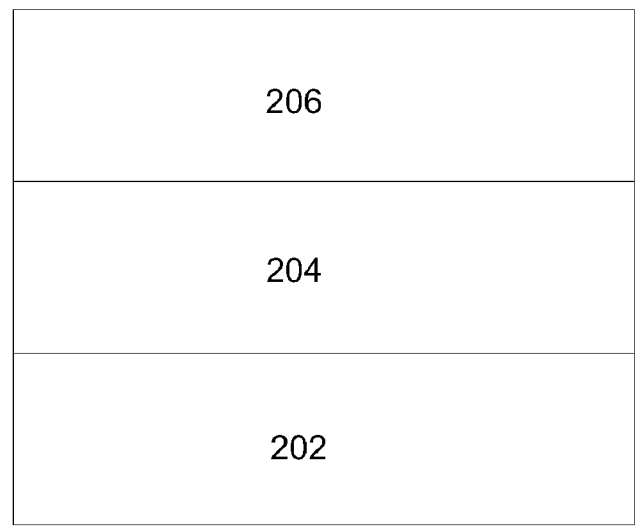
FIG. 6 showing a cross-sectional view in the process of forming a ring pattern in accordance with an embodiment of the present invention.
Figure 7:
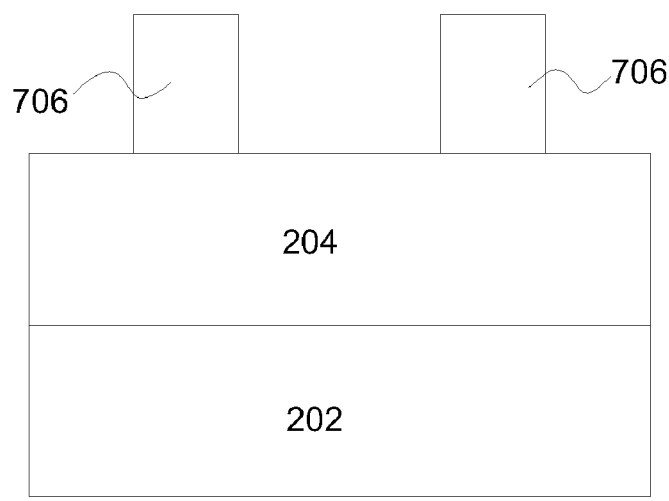
FIG. 7 showing a cross-sectional view in the process of forming a ring pattern in accordance with an embodiment of the present invention.
Figure 8:
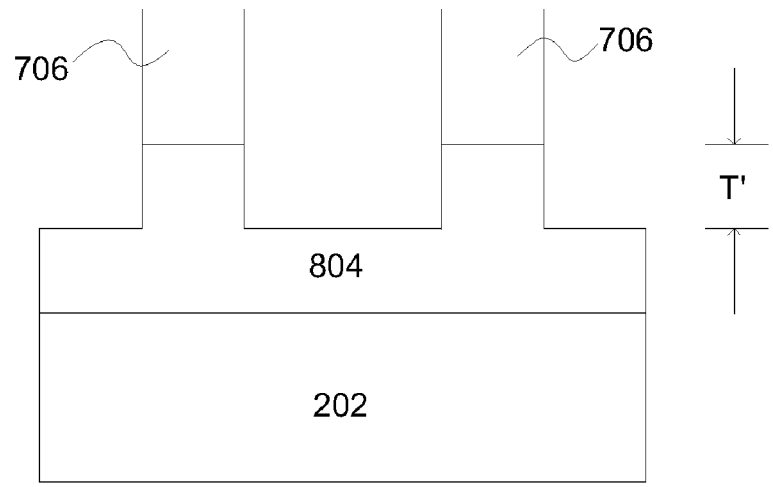
FIG. 8 showing a cross-sectional view in the process of forming a ring pattern in accordance with an embodiment of the present invention.
Figure 9:
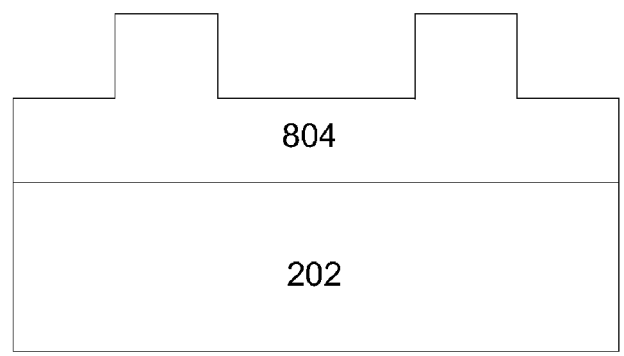
FIG. 9 showing a cross-sectional view in the process of forming a ring pattern in accordance with an embodiment of the present invention.
Figure 10:
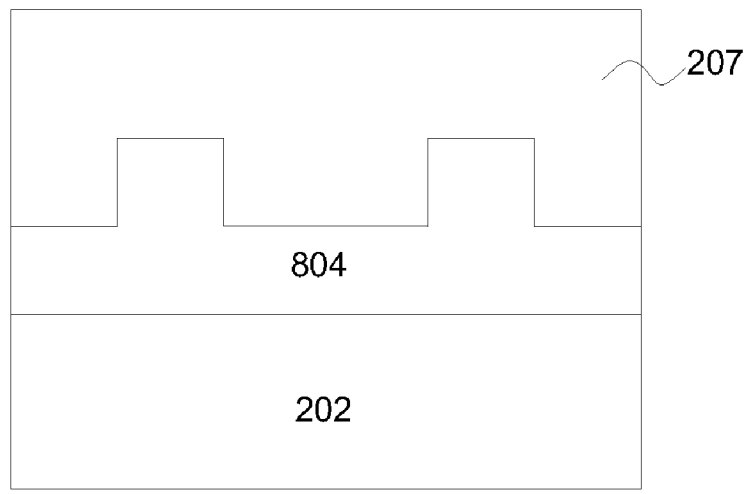
FIG. 10 showing a cross-sectional view in the process of forming a ring pattern in accordance with an embodiment of the present invention.
Figure 11:
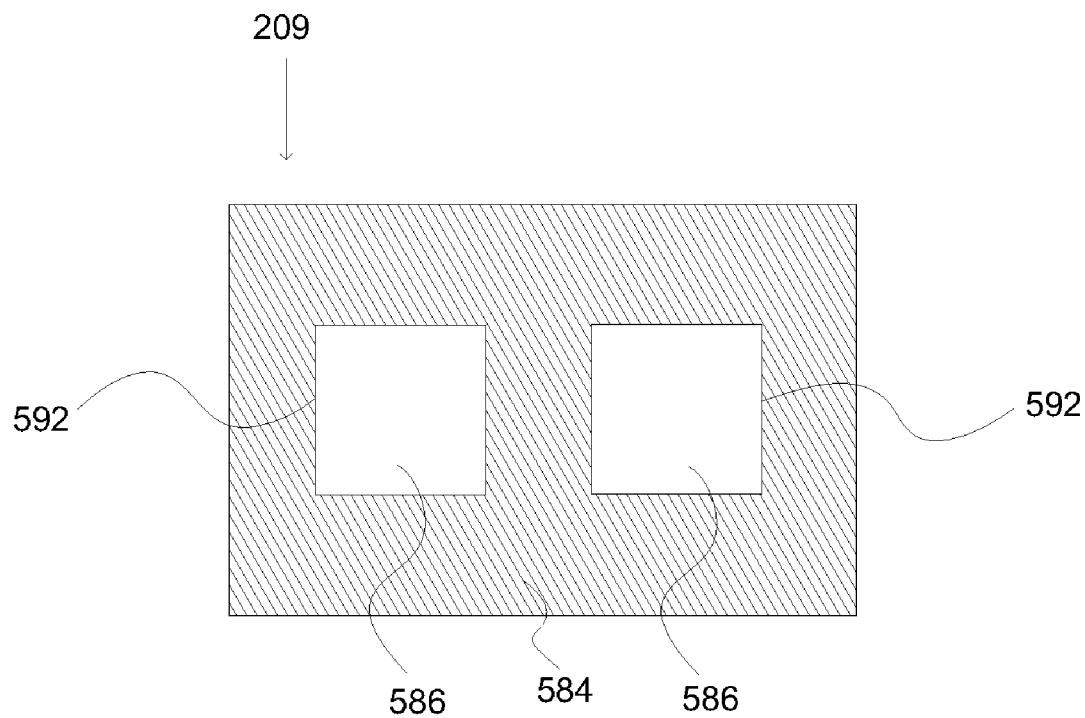
FIG. 11 showing a top view of a photomask pattern for use in the process of forming a ring pattern in accordance with an embodiment of the present invention.
Figure 12:
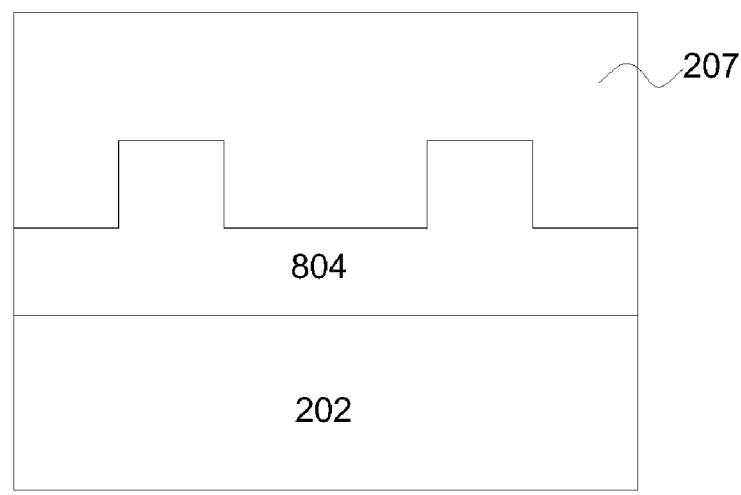
FIG. 12 showing a cross-sectional view in the process of forming a ring pattern in accordance with an embodiment of the present invention.
Figure 13:
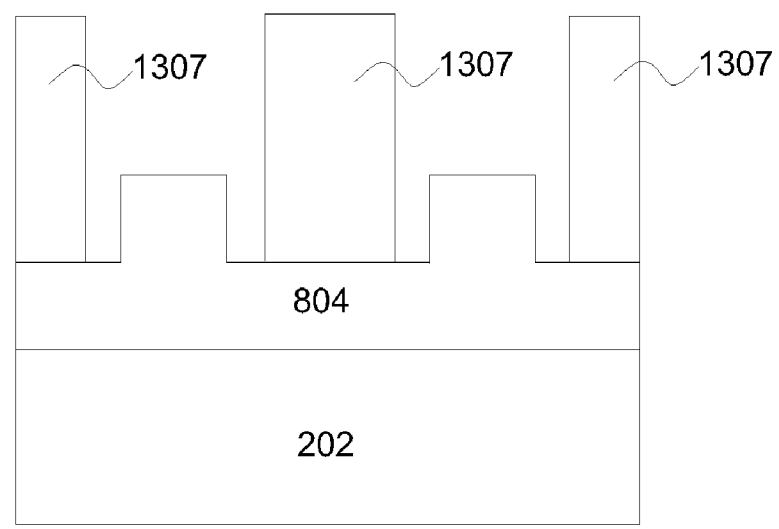
FIG. 13 showing a cross-sectional view in the process of forming a ring pattern in accordance with an embodiment of the present invention.
Figure 14:
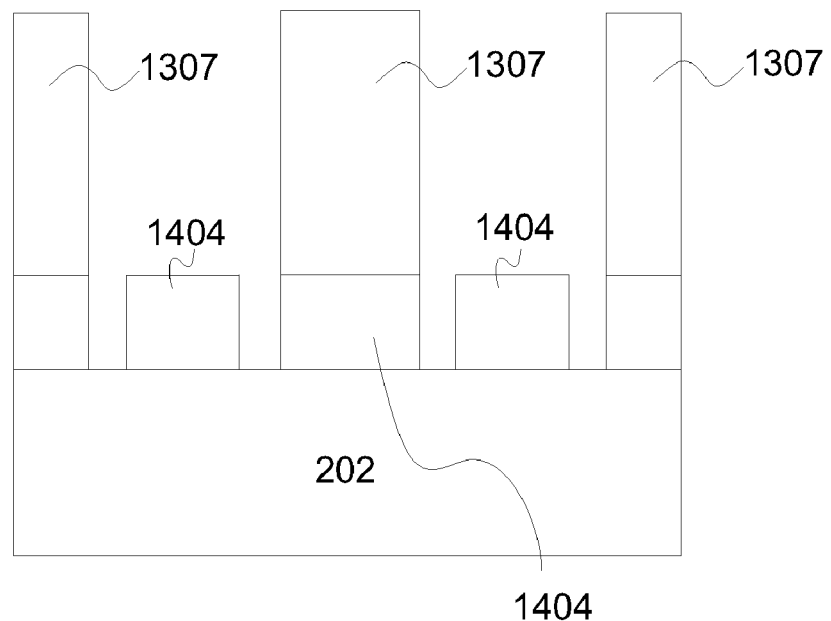
FIG. 14 showing a cross-sectional view in the process of forming a ring pattern in accordance with an embodiment of the present invention.
Figure 15:
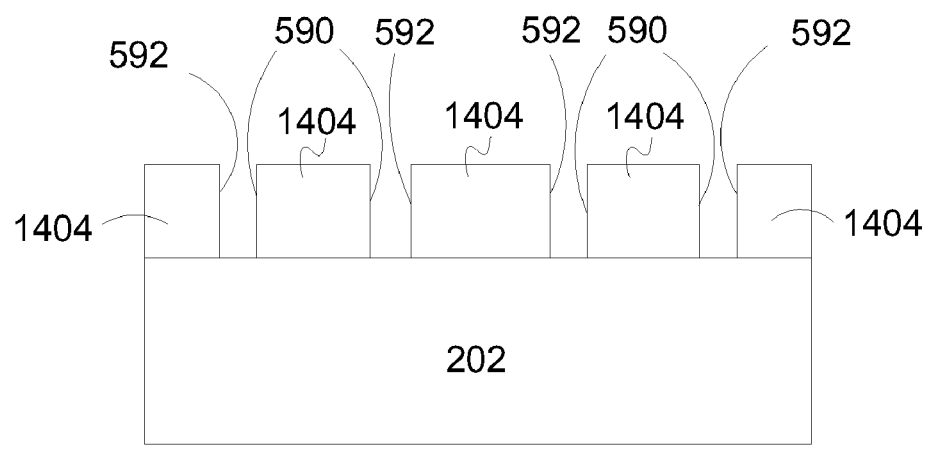
FIG. 15 showing a cross-sectional view of a ring pattern in accordance with an embodiment of the present invention.
Figure 16:
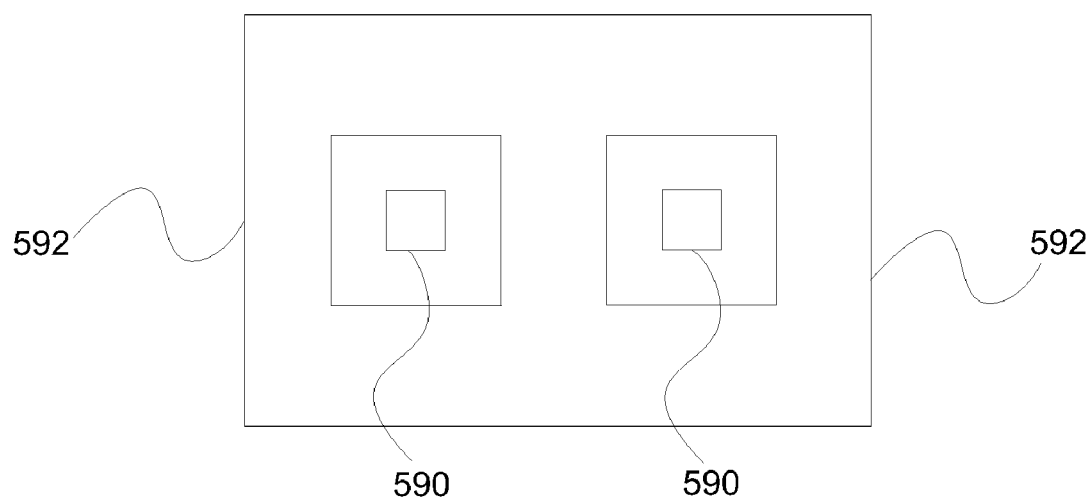
FIG. 16 showing a top view of a ring pattern in accordance with an embodiment of the present invention.

Referring FIG. 2 to FIG. 16, in one embodiment, the present invention provides a method of forming a ring pattern. In an exemplary embodiment, the ring pattern may be a circular ring, a square ring, an irregular ring or any other ring form. The method includes the step of providing a substrate 202, as shown in FIG. 2. The substrate 202 may be a semiconductor wafer in any process of requiring the ring pattern. Then, a dielectric layer 204 is formed on the substrate 202. The dielectric layer 204 has a thickness T, as shown in FIG. 3. In an exemplary embodiment, the dielectric layer 204 can be a carbon layer, preferably a pure carbon layer, and serves as a hard mask. Then, a first positive photoresist 206 is coated on the dielectric layer 204, as shown in FIG. 4. As shown in FIG. 5, a first mask 208 with a first pattern defining a first wall (inner wall) 509 of the ring pattern is provided. Then, an exposure step is performed on the first positive photoresist 206 through the first mask 208, as shown in FIG. 6. The exposed first positive photoresist 206 is then developed to form a first patterned photoresist layer 706, as shown in FIG. 7. As shown in FIG. 8, by using the patterned photoresist layer 706 as a mask, the dielectric layer 204 is etched to a predetermined depth T so that a first patterned dielectric layer 804 is formed after the pattern photoresist layer 706 is removed, as sown in FIG. 9. Then, a second positive photoresist 207 is formed on the first patterned dielectric layer 804, as shown in FIG. 10. As shown in FIG. 11, a second mask 209 with a second pattern defining a second wall (outer wall) 592 of the ring pattern is provided. Then, a second exposure step is performed on the second positive photoresist 207 through the second mask 209, as shown in FIG. 12. The second positive photoresist 207 is then develop to form a second patterned photoresist layer 1307, as shown in FIG. 13. By using the second patterned photoresist layer 1307 as a mask, the first patterned dielectric layer 804 is etched so that a patterned dielectric layer 1404 is formed, as shown in FIG. 14. After removing the second patterned photoresist layer 1307, the patterned dielectric layer 1404 with the ring pattern including the first wall 590 and the second wall 592 is formed, as shown in FIG. 15. FIG. 16 also shows a top view of the patterned dielectric layer 1404 with the ring pattern. Thus, a distance between the first wall 590 and the second wall 592 can be maintained and even reduced by the two-step exposure processes. Accordingly, the ring pattern is created with a higher resolution and a better profile control.

It should be noted because the first positive photoresist 206 is employed to define the first wall 590 of the ring pattern, the area 580 of the first mask 208 will be coated with a material, such as chromium (Cr) and becomes opaque. In one embodiment, the first mask 208 is made by glass, and the uncoated area 582 in the first mask 208 is transparent to the radiation and causes a corresponding portion of the first photoresist 206 to be exposed to the radiation during the first exposure step. Moreover, because the second positive photoresist 207 is employed to define the second wall 590 of the ring pattern, the area 584 of the second mask 209 will be coated with a material, such as chromium (Cr), so that the area 584 is not transparent to the radiation. In one embodiment, the second mask 208 can be also made by glass. The area 586 other than the area 584 in the second mask 209 remains uncoated so that a corresponding portion of the second photoresist 207 is exposed during the second exposure step. However, it will be obvious to those skilled in the art that the negative photoresist can be used by modifying the patterns of the photomasks, which is also in the scope of the present invention. It is well known by those skilled in art to modify the patterns of the masks when a negative photoresist is employed, so that the descriptions are omitted so as to simplify and not unnessarily obscure the features of the invention.

In an exemplary embodiment, the dielectric layer 204 is etched to a depth about ½ T by using the first patterned photoresist layer 706 as a mask. Accordingly, the first patterned dielectric layer 804 is also etched and the residual dielectric layer 204 forms the patterned dielectric layer 1404 with a depth about ½ T. The patterned dielectric layer 1404 includes a first portion previously protected by the first patterned photoresist layer 706 and then unprotected by the second photoresist layer 1307, and a second portion previously unprotected by the first patterned photoresist layer 706 and then protected by the second photoresist layer 1307. In this exemplary embodiment, the height of the first wall and the second wall are substantially the same. It is noted that the portion of the dielectric layer 204 unprotected by the first patterned photoresist layer 706 and the second patterned photoresist layer 1307 is finally etched away to define the inner wall 590 and the outer wall 592 of the ring pattern.

Furthermore, in one embodiment, the dielectric layer 204 can be a carbon layer 204, and especially a pure carbon layer. The selectivity of the carbon layer 204 is almost 100% with respect to the photoresist so that in the subsequent steps, such as dry etching or wet etching steps, the etchants primarily react with the carbon layer 204 and substantially not the photoresist. That is, the loss of the photoresist in the etching step is minimized, and accordingly, the first positive photoresist 206 and the second positive photoresist 207 can be thinner.

Although specific embodiments have been illustrated and described, it will be obvious to those skilled in the art that various modifications may be made without departing from what is intended to be limited solely by the appended claims.

The ivention claimed is:

1. A method of forming a ring pattern in a dielectric layer, the ring pattern having an inner wall and an outer wall enclosing the inner wall, said method comprising:
   (a) forming the dielectric layer;
   (b) etching an area of said dielectric layer outside the inner wall to a predetermined depth; and
   (c) etching an area of said dielectric layer inside the outer wall to form said inner wall and said outer wall simultaneously.

2. The method of claim 1, wherein said dielectric layer is a carbon layer.

3. The method of claim 2, wherein said carbon layer is a pure carbon layer.

4. The method of claim 1, wherein said predetermined depth is approximately half of a thickness of said dielectric layer.

5. The method of claim 1, wherein said step (b) comprises:
   (i) forming a first photoresist on said dielectric layer;
   (ii) providing a first mask with a first pattern defining said inner wall;
   (iii) performing an exposure on said first photoresist through the first mask; and
   (iv) developing said first photoresist to form a first patterned photoresist layer covering an area inside said inner wall; and
   (v) etching said dielectric layer by using the first patterned photoresist layer as a mask.

6. The method of claim 1, wherein said step (c) comprises:
   (i) forming a second photoresist on said dielectric layer;
   (ii) providing a second mask with a second pattern defining said outer wall;
   (iii) performing an exposure on said second photoresist through said second mask; and
   (iv) developing said second photoresist to form a second patterned photoresist layer exposing an area inside said outer wall; and
   (v) etching said dielectric layer by using the second patterned photoresist layer as a mask.

7. The method of claim 1, wherein said ring pattern is a circular ring, a square ring, an irregular ring, or any other ring form.

* * * * *